(12) United States Patent
Matsumura et al.

(10) Patent No.: US 7,751,994 B2
(45) Date of Patent: Jul. 6, 2010

(54) INTELLIGENT BATTERY SAFETY MANAGEMENT SYSTEM CONFIGURED TO COMPARE COLLECTED OPERATIONAL DATA WITH REFERENCE OPERATIONAL DATA

(75) Inventors: Naoki Matsumura, Tokyo (JP); Nobuhiro Otani, Chiba-ken (JP); Don J. Nguyen, Portland, OR (US); Kiyohiro Hamaji, Ibaraki-ken (JP); Andrew William Keates, Los Gatos, CA (US); Peter T. Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/906,006

(22) Filed: Sep. 29, 2007

(65) Prior Publication Data

US 2009/0088992 A1 Apr. 2, 2009

(51) Int. Cl.
*G01R 31/36* (2006.01)
*G06F 19/00* (2006.01)

(52) U.S. Cl. .................. 702/63; 702/58; 702/59; 320/106; 320/136; 320/137

(58) Field of Classification Search ................ 702/63, 702/58, 64, 59
See application file for complete search history.

(56) References Cited

U.S. PATENT DOCUMENTS

| 4,053,824 A | | 10/1977 | Dupuis et al. | |
|---|---|---|---|---|
| 5,298,346 A | * | 3/1994 | Gyenes | 429/90 |
| 5,408,170 A | | 4/1995 | Umetsu et al. | |
| 5,451,880 A | * | 9/1995 | Yamagishi et al. | 324/429 |
| 5,493,199 A | * | 2/1996 | Koenck et al. | 320/106 |
| 5,534,765 A | * | 7/1996 | Kreisinger et al. | 320/106 |
| 5,583,871 A | * | 12/1996 | Simmonds et al. | 320/151 |
| 5,652,502 A | * | 7/1997 | van Phuoc et al. | 702/63 |
| 5,726,554 A | * | 3/1998 | Freiman et al. | 320/157 |
| 5,767,659 A | * | 6/1998 | Farley | 320/106 |
| 6,100,670 A | * | 8/2000 | Levesque | 320/150 |
| 2002/0109506 A1 | | 8/2002 | Kawakami et al. | |
| 2003/0105601 A1 | * | 6/2003 | Kobayashi et al. | 702/63 |
| 2004/0207405 A1 | * | 10/2004 | Yang | 324/426 |
| 2005/0017686 A1 | * | 1/2005 | Sakakibara et al. | 320/132 |
| 2005/0046389 A1 | * | 3/2005 | Kim | 320/132 |
| 2005/0200332 A1 | | 9/2005 | Kangas et al. | |

(Continued)

OTHER PUBLICATIONS

"Intel—Common Building Block (CBB) Battery Pack for Notebooks", *Design Guide, Revision* 1.1, (Apr. 2007), Whole Document.

(Continued)

*Primary Examiner*—Hal D Wachsman
(74) *Attorney, Agent, or Firm*—Blakely, Sokoloff, Taylor & Zafman LLP

(57) ABSTRACT

A method and apparatus for intelligent battery safety management. Some embodiments of a method for managing battery operation may include receiving a battery pack in a device, where the battery pack is rechargeable and includes a battery cell. In some embodiments data may be collected regarding the operation of the battery cell in the device, and the collected data may be compared with a set of battery reference data. In some embodiments a determination may be made whether the battery cell is non-authentic or defective based at least in part on the comparison between the collected data and the battery reference data.

20 Claims, 4 Drawing Sheets

U.S. PATENT DOCUMENTS

2007/0052424 A1   3/2007   Okumura
2007/0194751 A1*  8/2007   Odaohhara .................. 320/112
2008/0048617 A1   2/2008   Yoshida
2008/0238357 A1  10/2008  Bourilkov et al.

OTHER PUBLICATIONS

USPTO, "42P26606 OA Mailed Oct. 7, 2008 for U.S. Appl. No. 11/966,657", (Oct. 7, 2008), Whole Document.

"42P26606 FOA Mailed Apr. 2, 2009 for U.S. Appl. No. 11/966,657", (Apr. 2, 2009), Whole document.

Non-Final Office Action for U.S. Appl. No. 11/966,657, Mailed Oct. 5, 2009, 11 pages.

Non-Final Office Action for U.S. Appl. No. 12/059,967, Mailed Oct. 6, 2009, 9 pages.

* cited by examiner

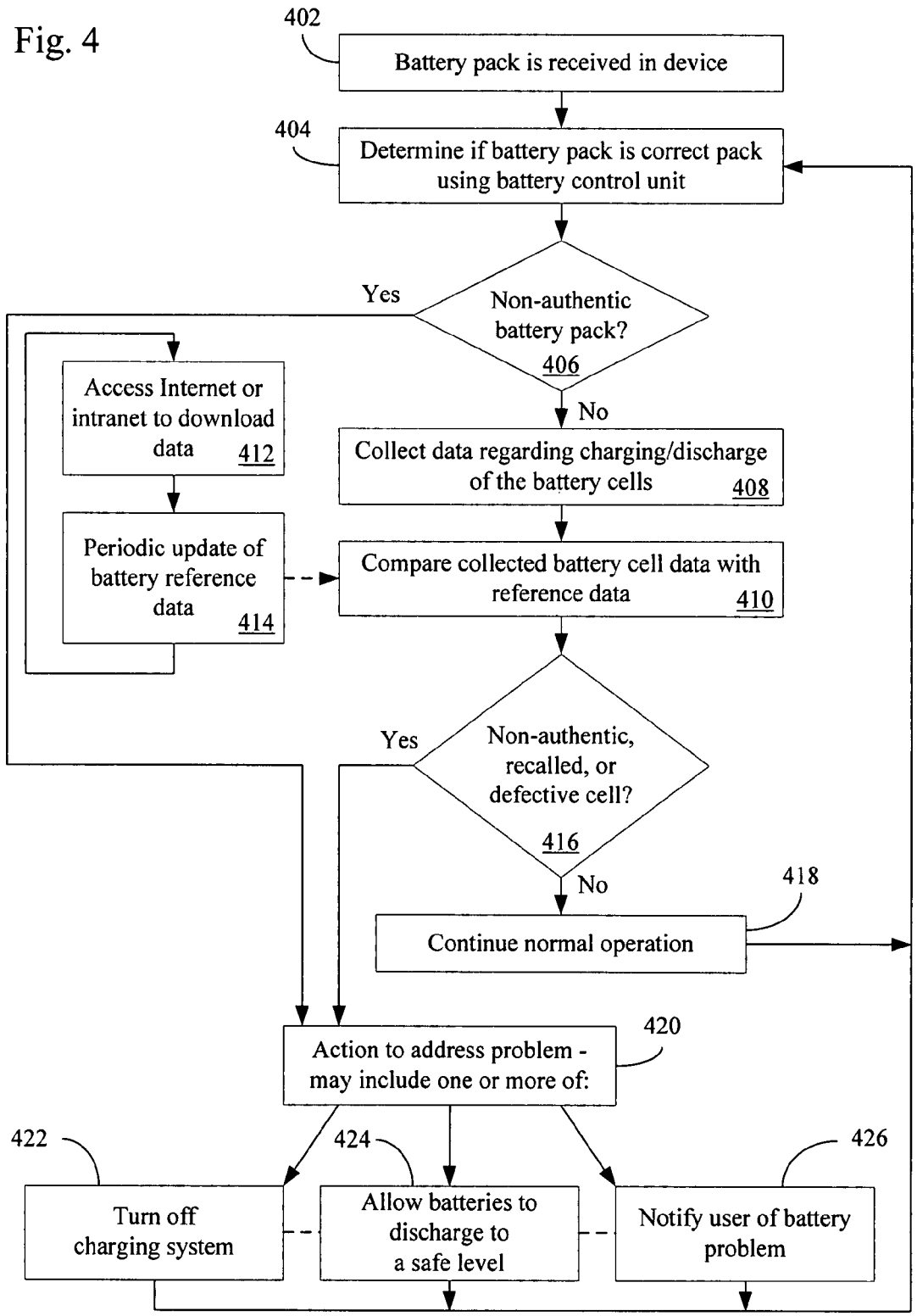

US 7,751,994 B2

INTELLIGENT BATTERY SAFETY MANAGEMENT SYSTEM CONFIGURED TO COMPARE COLLECTED OPERATIONAL DATA WITH REFERENCE OPERATIONAL DATA

FIELD

Embodiments of the invention relate to rechargeable storage batteries. More particularly, embodiments of the invention relate to a system and method for intelligent battery safety management.

BACKGROUND

Rechargeable batteries continue to expand into greater numbers of consumer and other electronic devices. In particular, laptop and notebook computers and similar devices utilize batteries that are relied upon to provide portable computing power.

Although portable computing devices can be utilized in any location, such devices are not generally charged and then run solely on battery power. Much of the operation of such a mobile device may actually be in stationary operation while connected to an AC adapter. When a notebook PC (NBPC) is used with an AC adapter, an attached battery pack is fully charged most, or all, of the time. However, leaving the battery pack in a charged state can create safety hazards.

In one example, there is a potential risk if a low quality battery cell or pack is used in a mobile device. For example, the cathode and anode in a lithium-ion (Li-ion) battery can potentially swell at a charged state. If a low quality cell contains metal particles, the charged state may cause the metal particles to penetrate a separator that is between the cathode and anode, and thus may cause an internal short-circuit.

In a second example, users may use an inauthentic battery pack or cell in a mobile computer device, where "inauthentic" cell or pack indicates the battery cell or pack is not supported by the device manufacturer. If a battery control unit, also referred to herein as a BMU (Battery Management Unit), is mismatched with the battery pack or cell, this may result in the battery being overcharged. The overcharging of a battery can result in significant safety issues, such as explosion, ignition, or other battery failure. An inauthentic cell or pack may be of low quality, thus may result in dangerous conditions in charging.

BRIEF DESCRIPTION OF THE DRAWINGS

Embodiments of the invention are illustrated by way of example, and not by way of limitation, in the figures of the accompanying drawings in which like reference numerals refer to similar elements:

FIG. 4 is a flowchart to illustrate an embodiment of a battery management process.

DETAILED DESCRIPTION

Figure 1:
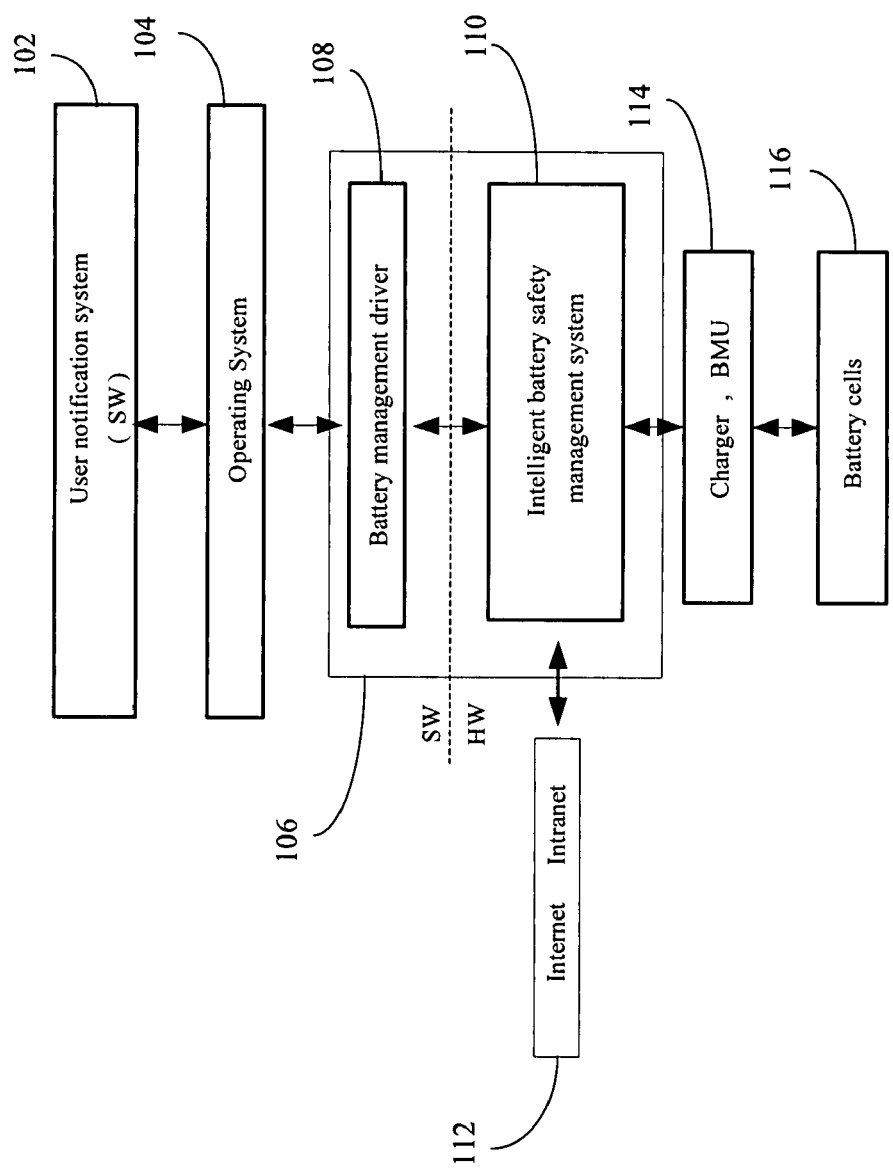
FIG. 1 is an illustration of an embodiment of battery management processes.

An embodiment of the invention concerns intelligent battery safety management.

As used herein:

"Battery" means any device that generates electrical potential through a chemical reaction. In particular, a battery includes a rechargeable battery that may be restored to operation by a charging operation. Batteries may include, but are not limited to, nickel cadmium (NiCad), lithium ion (Li-ion), and other rechargeable batteries.

"Mobile computing device" means any personal computer or similar computing device that provides mobile operation and that includes a rechargeable battery power source. The term mobile computing device may include, but is not limited to, a notebook or laptop computer, handheld computer, tablet PC, ultra-mobile personal computer (UMPC), mobile Internet device (MID), smartphone, personal digital assistant (PDA), or other similar device.

"Battery pack" means a package of one or more battery cells. Battery packs are commonly used in operation of many electronic devices, include mobile computing devices.

"Battery control unit" means a unit to control certain operations of a battery. A battery pack may include a battery control unit.

In some embodiments, an intelligent battery management system is provided for a mobile computing device or other device containing a rechargeable battery. In an embodiment, the management system determines when non-authentic or defective battery cells are inserted in the device.

In some embodiments, a system detects non-authentic or defective batteries by comparing charge or discharge cycle curve data for the battery cells with reference curve data.

In some embodiments, a system will prevent the charging of a non-authentic or defective battery cells, or will reduce the charging level of such battery cell to maintain safety of operation.

In general, a battery pack consists of one or more battery cells. A battery pack may further include a battery control unit to control certain battery management operations. A battery control unit may also be referred to herein as a battery management unit (BMU). A battery control unit is intended to monitor battery operations and conditions, such as battery voltage, capacity, temperature, current, and other factors. The battery control unit is intended to prevent overcharge, deep discharge, and over-current to provide safety in operation.

Many mobile computers attempt to exclude non-authentic battery packs by communicating with or otherwise address the battery control unit of the battery pack to confirm that only authentic battery packs are allowed full operation. Non-authentic battery packs may have significantly different characteristics, and thus may be dangerous if such batteries are over charged or a device otherwise operates in a manner that does not recognize the true characteristics of the batteries.

However, even if a computer operates to ensure that battery pack is a authentic battery pack, certain problems may still remain, including the following:

(a) Users sometimes exchange one or more of the cells in a battery pack, and utilize the same battery pack and battery control unit. The battery control unit will not detect an inauthentic battery cell, and thus will continue to operate in a device as if the battery cells are authentic. In such a situation, the mobile computer device will generally determine that the battery pack is genuine because the battery control unit is the original authentic unit. However the battery cells have been exchanged for non-authentic batteries that may have very different characteristics, resulting in a potentially dangerous situation.

(b) When certain battery-related issues occur that may have an impact on users, such as a product recall, users will generally only become aware of the recall from news and information sources, such as television, newspapers, or the Internet, if such users hear about the situation at all. Not all users will become aware of or check the applicability of battery recall information. Thus, many users will not return the battery packs in question because they will be unaware of the situation. This may create a significant safety issue, and a battery control unit generally will not provide any solution for this problem.

(c) Users often are unaware that leaving a low-quality or inauthentic Li-ion battery in a charged state may be unsafe. Such users may not be aware that batteries may vary in quality or may have different charging characteristics. The safety issues regarding rechargeable batteries are not well known, and such problems are not visible to the user.

(d) If users buy battery packs from unscrupulous retailers, the users may believe they are purchasing authentic battery supplies, while in fact they are receiving low quality or inauthentic battery cells. If the battery charging units in such battery packs are accepted by the computer or other electronic device because the battery control unit matches the expected value, a user will have no reason to believe that there is a problem.

(e) Even if a battery pack is authentic, and contains authentic battery cells, the battery cells may contain or eventually develop defects that alter the charging characteristics of the battery cells.

In some embodiments, a method is provided to ensure battery safety by determining whether one or more battery cells are defective or are not authentic. In some embodiment, the method includes determining the charging characteristics of the battery cells and comparing such charging characteristics to the known battery characteristics.

In some embodiments, a system may include a combination of hardware and software. In an embodiment, a hardware module may include reference data regarding batteries, including the charging or discharging characteristics of battery cells, among other data. In an embodiment, a hardware module may further include hardware that is capable of establishing an Internet, intranet, or other data source connection to obtain updated battery reference data, including new data regarding charging characteristics of recalled or defective batteries. The hardware may further be capable of communicating with the battery pack, battery charger, or device operating system. In addition, software may be provided that is operable to obtain battery charging data for the current battery cells. Such data may be derived from the current battery pack, the battery charger, or the device containing the battery pack. Such reference data may be obtained periodically, such as once each day.

Reference data to identify a battery pack or battery cell may include the voltage-capacity relationship for the battery, which may be described in a charge/discharge curve, in addition to identifying information such as the manufacturer name, manufacture date, serial number, and similar information. Reference data, for example a charge/discharge curve, may be, but is not limited to, a function of temperature, cycle count, current, and other factors. Further, there may be information to identify the device, such as a personal computer, that should be utilizing a battery pack. Such information may include the manufacturer name, serial number, and related information.

In some embodiments, a device includes reference data to check against the current battery data. The reference data may be originally stored or embedded in the device by the manufacturer before shipping. The reference data may also be periodically updated, such as through Internet, intranet, or other data source access. The updated reference information may include reference information regarding, for example, recalled battery cells or other defective or non-authentic battery cells.

In some embodiments, a system monitors battery operation to periodically obtain current battery data to compare against the reference data. If the comparison of the current battery data with the reference data indicates a mismatch or error, the system will determine that the battery pack or battery cell is non-authentic or defective. In some embodiments, if there is a determination that a battery pack or cell is non-authentic or defective, the system may cause the battery charger to stop charging, and to let the battery pack discharge automatically to a state that is recommended by the device manufacturer (such as a 50% charge). In some embodiments, the system may further inform the user regarding the action taken. For example, the system may inform the user through an operating system, such as, in one example, when the device is turned on or booted up. If the system determines that the attached battery pack has no problems, this invention may inform the user that the battery is authentic.

In some embodiments, the charge/discharge curve data for the current battery and the charge/discharge curve data contained in the reference data are used in a comparison to detect non-authentic or defective battery cells. This may be done because the charge/discharge curves are different among different battery cells produced by different battery suppliers. In some embodiments, the comparison of charge/discharge curve data will allow detection of non-authentic battery cells even if, for example, users act to exchange only the battery cells in a battery pack and use the same battery control unit in the battery pack.

In some embodiments, a system or device may allow for updating of reference information even when an operating system for the device is not running. For example, a system may update the reference data periodically when the charger hardware is able to establish an Internet or intranet connection. In some embodiments, when a battery recall occurs, a system will automatically determine whether the attached battery pack is subject to recall, and to inform the user about this. If the battery pack is under recall, the system operates to cause the battery pack to return to a safer state by reducing the charge on the battery.

In some embodiments, if the device determines that a battery is non-authentic, subject to recall, or otherwise defective, a user may be allowed to choose whether or not to report the result of the system's action to the device manufacturer, such as to the computer manufacturer for a personal computer.

Thus, in some embodiments, a system is capable of detecting a non-authentic or defective battery cell in addition to detecting the presence of a non-authentic battery pack. In addition, the system is capable of causing the battery pack to transition to a safer state by reducing or halting the charge on the battery, and allowing the battery to discharge.

FIG. 1 is an illustration of an embodiment of battery management processes. In this illustration, an embodiment of a battery system 106 for a device, where the battery system 106 includes an intelligent battery safety management system 110 that communicates with a battery charger, battery management unit, or both 114 to determine the authenticity of battery cells 116 used in the device. In some embodiments, the battery safety management system may utilize a battery management driver 108 for the device to collect data regarding the operation of the battery cells 116. The battery safety management system 106 may compare the collected data, such as in the form of charge/discharge curve data for the battery cells 116, against reference data. The reference data may include charge/discharge data for battery cells that are non-authentic, have been recalled, or are otherwise defective. In order to obtain or update such reference data, the battery safety management system 110 may periodically communicate with the Internet or an intranet 112 to obtain recent information.

If a battery is found to be non-authentic, recalled, or otherwise defective, the battery safety management system 110 may act to address the problem by, for example, turning off the charger 114 and allowing the battery cells to discharge to a safe level.

The battery management driver 104 may communicate through an operating system 104 for the device to address the determinations regarding the attached battery pack. The operating system 104 may, for example, provide for operation of a user notification system 102, which may represent software that will inform the user regarding the battery issues that have occurred, such as the existence of a non-authentic, recalled, or otherwise defective battery cell in the attached battery pack.

Figure 2:
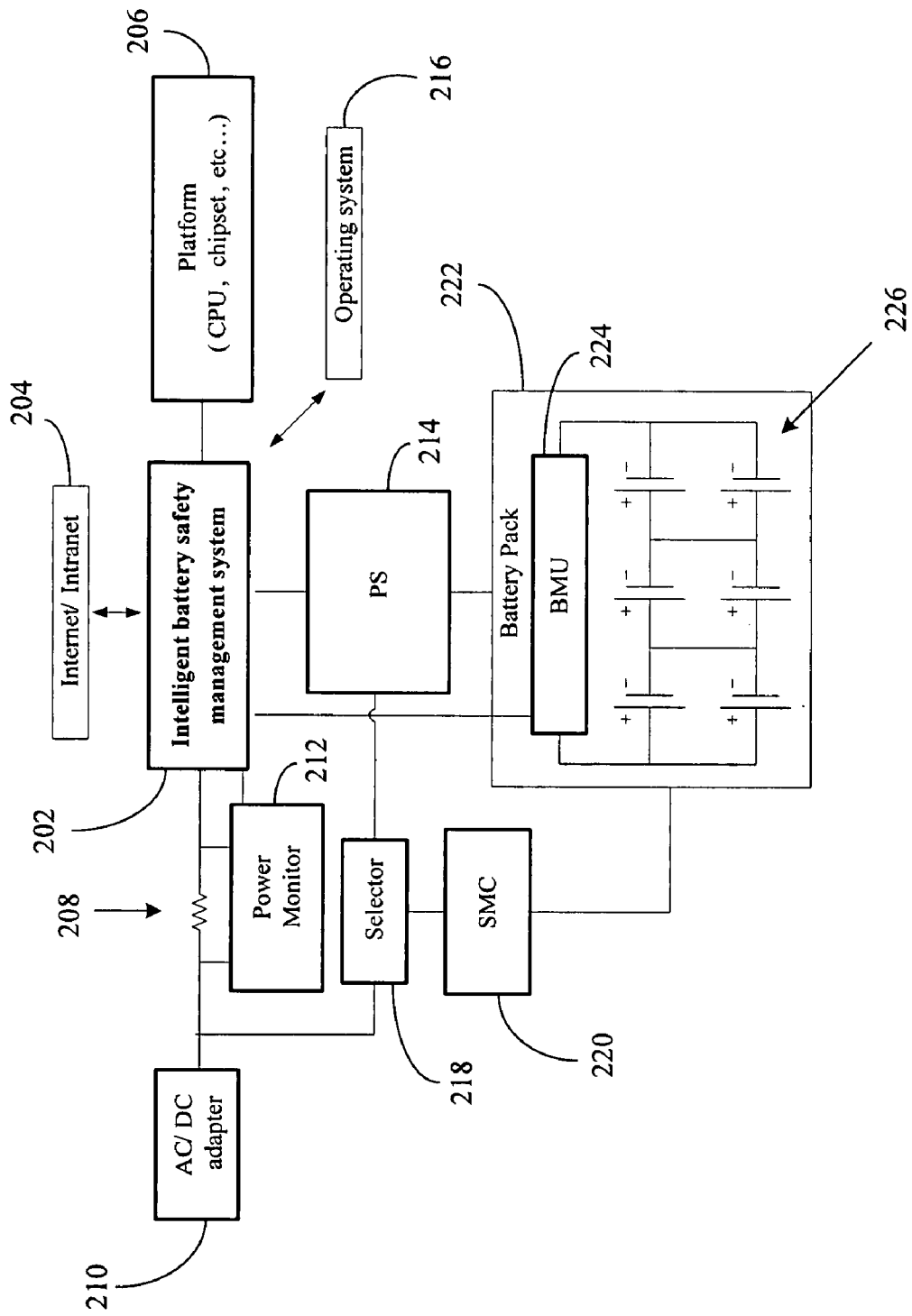
FIG. 2 provides a schematic diagram of an embodiment of an intelligent battery management system.

FIG. 2 provides a schematic diagram of an embodiment of an intelligent battery management system. In this illustration, an AC/DC adapter 210 may provide power for battery charging, such as the charging of a battery pack 222. The battery pack may include a battery management unit 224 and multiple battery cells 226. A power monitor 212 may monitor power, shown as monitoring power across a system resistance 208. The power output of the adapter 210 is also connected to a selector 218 to select operation of a power switch (PS) 214 coupled with the battery pack 222, and thus to control the charging of the battery pack 222. A system management controller (SMC) 220 is used to interface with the battery pack. The SMC 220 operates to control the selector 218.

In some embodiments, an intelligent battery safety management system 202 provides for management of the charging of the battery pack 222. In some embodiments, the battery safety management system 202 operates to ensure that battery pack 222 is authentic, and to further ensure that the battery cells 226 are authentic, have not been recalled, and are not otherwise defective. In some embodiments, the battery safety management system 202 operates to compare the operation of the battery cells to reference data, and, based at least in part on such comparison, to determine whether there are any battery cell problems. Such comparison may include the comparison of collected charge/discharge data for the battery cells 226 with reference data to detect non-authentic battery cells, recalled battery cells, or otherwise defective battery cells.

In some embodiments, the battery safety management system 202 may receive or update the reference data via a connection with the Internet or an intranet 204. In some embodiments the connection to the Internet or intranet may be available directly without booting up an operating system 216. In some embodiments, the battery safety management system 202 communicates with the operating system 216 regarding battery problems that are detected so that users may be notified. In some embodiments, the battery safety management system 202 further communicates with the system platform (including the central processing units (CPUs), chipset, and other elements) regarding the battery operation to receive information, which may include reference data, for allowable battery packs and battery cells. The battery safety management system 202 may further communicate with the platform 206 to allow the platform to take any actions needed to address any battery problems that are detected.

Figure 3:
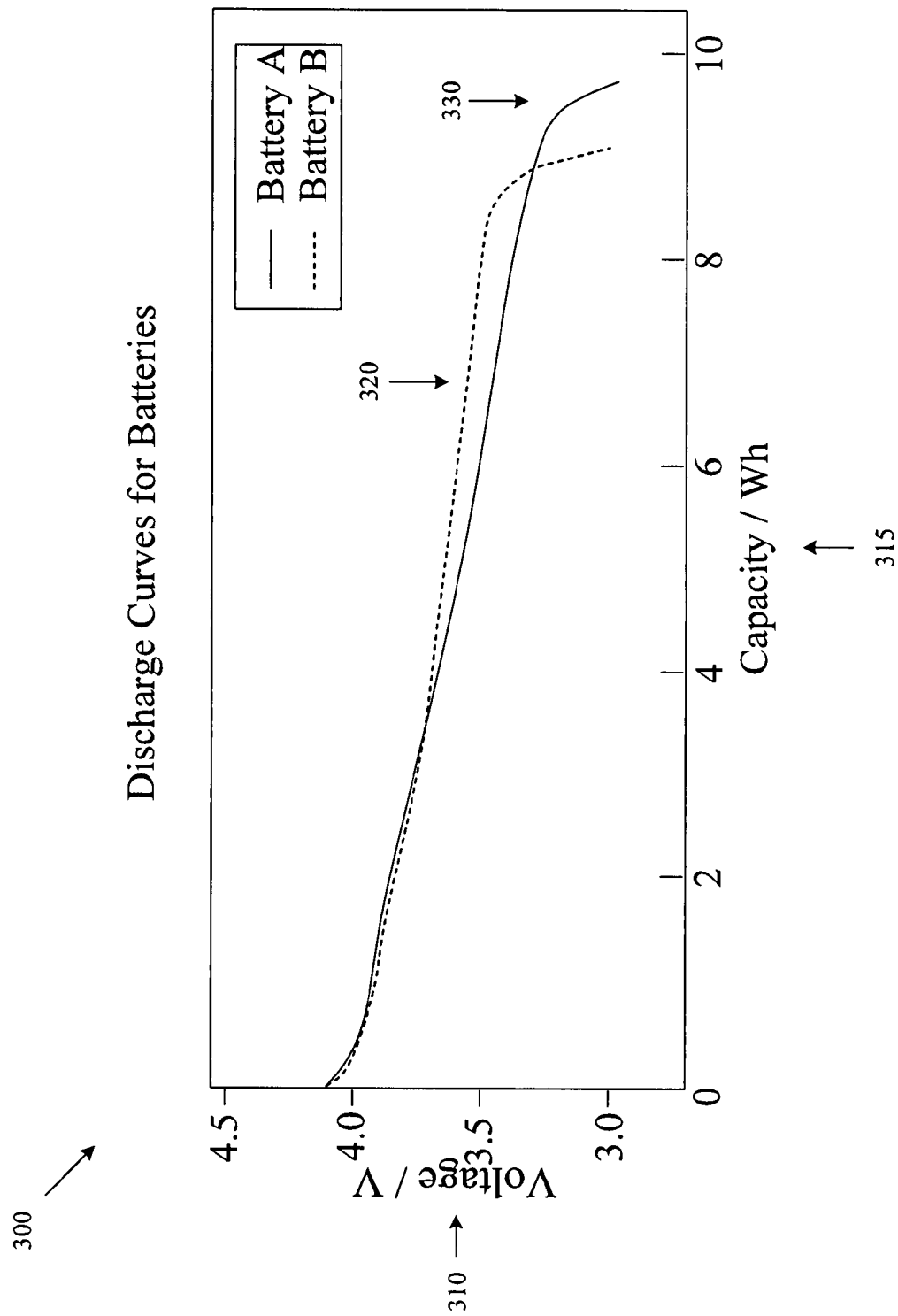
FIG. 3 is an illustration of an embodiment of comparison of battery discharge curve data.

FIG. 3 is an illustration of an embodiment of comparison of battery discharge curve data. In this illustration, a diagram 300 provides the discharge curves for two different battery cells. The discharge curve data may be a part of the data collected for attached batteries, as well as the reference data used to detect non-authentic, recalled, or otherwise defective batteries. While FIG. 3 illustrates one type of curve, other types of curves and curve data may be utilized in various embodiments. Further, embodiments are not limited to one or two curves, but may include any number of curves of varied types, as those of skill in the art will appreciate. As shown, the curves illustrate the relationship between battery voltage in volts 310 and battery capacity in watt hours 315. The curves shown show discharge for a battery A 330 and a battery B 320. As can be seen, in this instance the curves demonstrate that battery A 330 has a larger battery capacity at lower voltages than battery B 320. In some embodiments, the battery charge or discharge curves may be compared to determine, for example, whether a battery cell in a battery pack that should be of battery type A 330 is actually a different battery, battery B 320, and thus is a non-authentic battery for a particular device.

FIG. 4 is a flowchart to illustrate an embodiment of a battery management process. In this illustration, a battery pack may be received in a device 402. The device may be a personal computer or other device utilizing battery power at least part of the time. The device may determine whether the battery pack is the authentic battery pack for the device using the battery control unit of the battery 404. If the battery pack is a non-authentic battery pack 406, the device may proceed to handle the problem by, for example, turning off the charging system 420, allowing the batteries to discharge to a safe level 422, and notifying the user of the battery problem 424.

If the battery pack appears to be authentic 406, there may still be issues regarding the battery cells of the battery pack. In some embodiments, data is collected regarding the charging, discharging, or both of the battery pack or the battery cells 408. The collected battery pack and battery cell data is compared with reference data to determine authenticity 410. With regard to the reference data, there is also a process for access the Internet or an intranet to download data 412 to obtain periodic updates of the battery reference data 414. The reference data updates may include new recall information or new information regarding other defective cells.

If there is a non-authentic, recalled, or otherwise defective battery pack or cell 416, the system will operate to address the problem by taking appropriate actions 420. In some embodiments, the system may determine actions to address the problem based at least in part on the comparison of the collected data to the reference data, and the type and severity of the detected problem. In one example, the determination may be based on the extent to which the battery curve data matches or diverges from reference curve data, such as, for example, the curve data illustrated in FIG. 3. The actions to be taken may include, but are not limited to, turning off the charging system 422, allowing the batteries to discharge to a safe level 424, and notifying the user of the battery problem 426. The system may take any one or more of such actions in any order as appropriate under the particular circumstances. In an example, the system may choose to turn off charging immediately. If the battery is not determined to be non-authentic, recalled, or otherwise defective, the system may continue with normal operation 418.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention may include various processes. The processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Portions of the present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form, but processes can be added to or deleted from any of the methods and information can be added or subtracted from any of the described messages without departing from the basic scope of the present invention. It will be apparent to those skilled in the art that further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method for managing battery operation comprising:
   collecting data indicative of the operation of a battery cell in a rechargeable battery pack coupled to a device to be powered by the battery pack;
   updating, from a database remote to the device, a set of battery reference data, the updating automatically performed periodically;
   comparing the collected data with the set of battery reference data; and
   reducing a charging level to maintain the battery pack at less than full capacity in response to the comparison indicating a mismatch between the collected data and battery reference data associated with a battery cell authentic to the device, or in response to the comparison indicating a match between the collected data and battery reference data associated with a non-authentic or recalled battery cell.

2. The method of claim 1, wherein the data collected includes voltage-capacity data characterizing the charging, discharging, or both charging and discharging of the battery cell; wherein the battery reference data includes reference charging data or reference discharging data associated with at least one of an authentic battery cell, a non-authentic battery cell or recalled battery cell; and wherein the comparison is between the collected charging/discharging data and the reference charging/discharging data.

3. The method of claim 1, wherein the updating of the reference data is performed when an operating system for the device is not running, and wherein the updating is performed via a connection between a battery management system and the Internet, an intranet, or other data source.

4. The method of claim 1, wherein the reference data includes information to identify the device.

5. The method of claim 1, wherein reducing the charging level to maintain the battery pack at less than full capacity further comprises halting charging of the battery pack and allowing the battery pack to discharge to a voltage corresponding to approximately 50% charge in response the comparison.

6. The method of claim 1, further comprising notifying a user regarding an inconsistency between the collected data and the battery reference data.

7. The method of claim 1, further comprising determining whether the battery pack is authentic for the device based on a comparison between identifying information for a battery control unit embedded in the battery pack and reference data identifying a battery pack that should be utilized by the device.

8. The method of claim 1, wherein the data collected includes information to identify both the battery pack and the device utilizing the battery pack;
   wherein the reference data includes at least one of a manufacturer of the device or a serial number of the device; and wherein the charging level is reduced upon the battery pack identifying information being inconsistent with the reference data.

9. The method of claim 1, wherein the collected data is derived from the battery pack.

10. The method of claim 1, wherein the comparison indicates an inconsistency between the operation of the battery pack and the set of battery reference data.

11. A battery system for a device comprising:
    a battery charger to provide power to a rechargeable battery pack, the battery pack including a battery control unit and one or more battery cells; and a battery management system to collect data regarding the operation of the one or more battery cells, to periodically retrieve a set of battery reference data, to compare the collected data to the set of reference data, and to reduce a charging level of the battery pack to less than full capacity, in response to the comparison indicating a mismatch between the collected data and battery reference data associated with a battery cell authentic to the device, or in response to the comparison indicating a match between the collected data and battery reference data associated with a non-authentic or recalled battery cell.

12. The battery system of claim 11, wherein the battery management system includes a connection to the Internet, an intranet, or other data source, and wherein the battery management system is configured to obtain an update to the reference data using the connection when an operating system of the device is not running.

13. The battery system of claim 12, wherein the update to the reference data includes data regarding recalled batteries.

14. The battery system of claim 11, wherein the collected data includes voltage-capacity data characterizing the charging, discharging, or both charging and discharging of the one or more battery cells;
wherein the battery reference data includes reference charging data or reference discharging data for at least one of an authentic battery cell, a non-authentic battery cell or recalled battery cell; and wherein the comparison is between the collected charging/discharging data and the reference charging/discharging data.

15. The battery system of claim 11, wherein the battery management system is configured to halt the charging of the battery pack by the battery charger in response to the comparison.

16. The battery system of claim 11, wherein the battery management system is to notify an operating system of the device in response to the comparison.

17. The battery system of claim 11, wherein the device is a mobile computing device.

18. The battery system of claim 11, wherein the data collected includes information to identify both the battery pack and the device utilizing the battery pack;
wherein the reference data includes at least one of a manufacturer of the device or a serial number of the device; and wherein the battery management system is to reduce the charging level upon determining that the battery pack identifying information is inconsistent with the reference data.

19. The battery system of claim 11, wherein the collected data is derived from the battery pack.

20. The battery system of claim 11, wherein the comparison indicates an inconsistency between the operation of the battery pack and the set of battery reference data.

* * * * *